United States Patent [19]

Grugett

[11] Patent Number: 4,583,008

[45] Date of Patent: Apr. 15, 1986

[54] RETRIGGERABLE EDGE DETECTOR FOR EDGE-ACTUATED INTERNALLY CLOCKED PARTS

[75] Inventor: Bruce C. Grugett, Palm Bay, Fla.

[73] Assignee: Harris Corporation, Melbourne, Fla.

[21] Appl. No.: 469,818

[22] Filed: Feb. 25, 1983

[51] Int. Cl.[4] .......................................... H03K 17/28
[52] U.S. Cl. ................................. 307/265; 307/234;
307/269; 307/443; 307/602; 328/55; 328/63
[58] Field of Search ............... 328/55, 63, 111, 112;
307/265, 234, 440, 445, 601, 602, 443, 517, 269

[56] References Cited

U.S. PATENT DOCUMENTS

| | | | |
|---|---|---|---|
| 3,504,288 | 3/1970 | Ross | 328/63 |
| 3,786,357 | 1/1974 | Belle Isle | 328/20 |
| 3,835,336 | 9/1974 | Block | 328/111 |
| 4,061,975 | 12/1977 | Sugai | 307/265 |
| 4,069,429 | 1/1978 | White et al. | 307/265 |
| 4,077,010 | 2/1978 | Ryon | 328/20 |
| 4,109,209 | 8/1978 | Bismarck | 328/55 |
| 4,233,525 | 11/1980 | Takahashi et al. | 328/112 |

Primary Examiner—Stanley D. Miller
Assistant Examiner—D. R. Hudspeth
Attorney, Agent, or Firm—Barnes & Thornburg

[57] ABSTRACT

A retriggerable edge detector is provided having a means for receiving digital input signals, at least two signal transmitting paths connected to that signal receiving means, one of which paths transmits the input signal with predetermined delay, output gating means for producing an output signal as a function of the signals transmitted by the signal paths, and wherein logic means are provided in the delay signal path so as to cause the output gating means to produce a signal output pulse of predetermined, constant width in response to the last of one or more input signals, irrespective of the time between inputting of these input signals. The logic means provides for a portion of the delay signal path to be reset to its input state in a shorter time than the total delay line propagation time.

14 Claims, 7 Drawing Figures

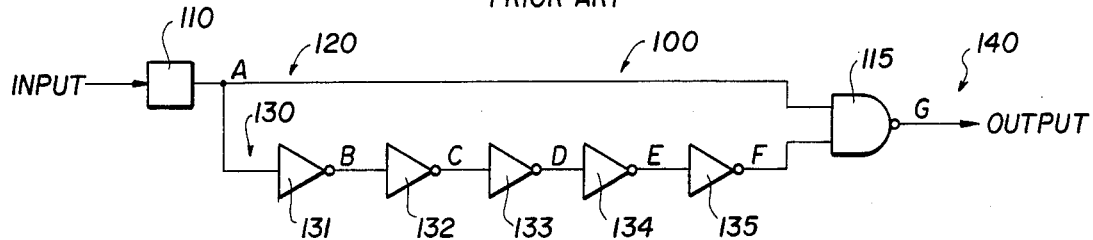
FIG.1 PRIOR ART
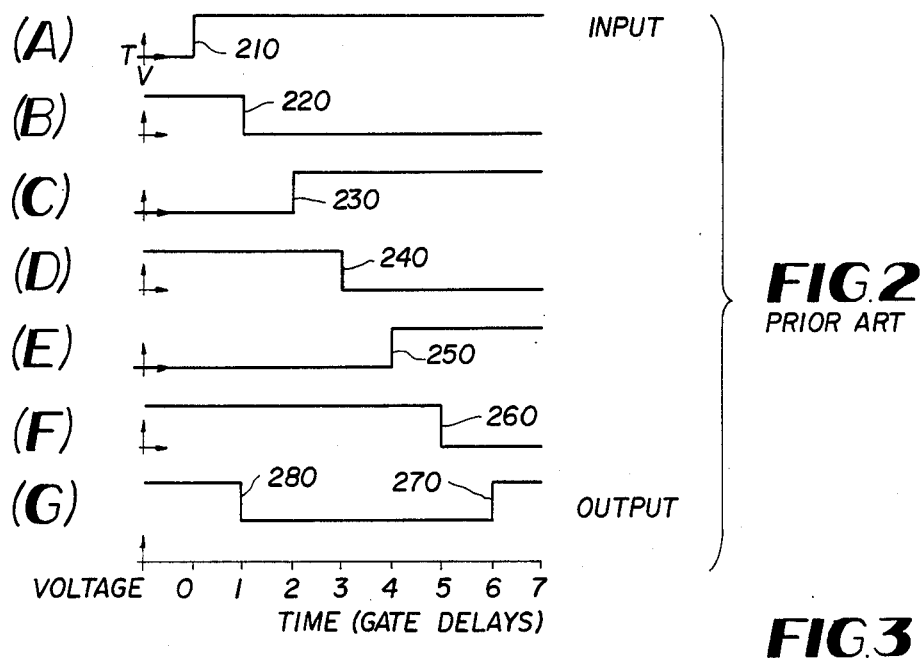
FIG.2 PRIOR ART
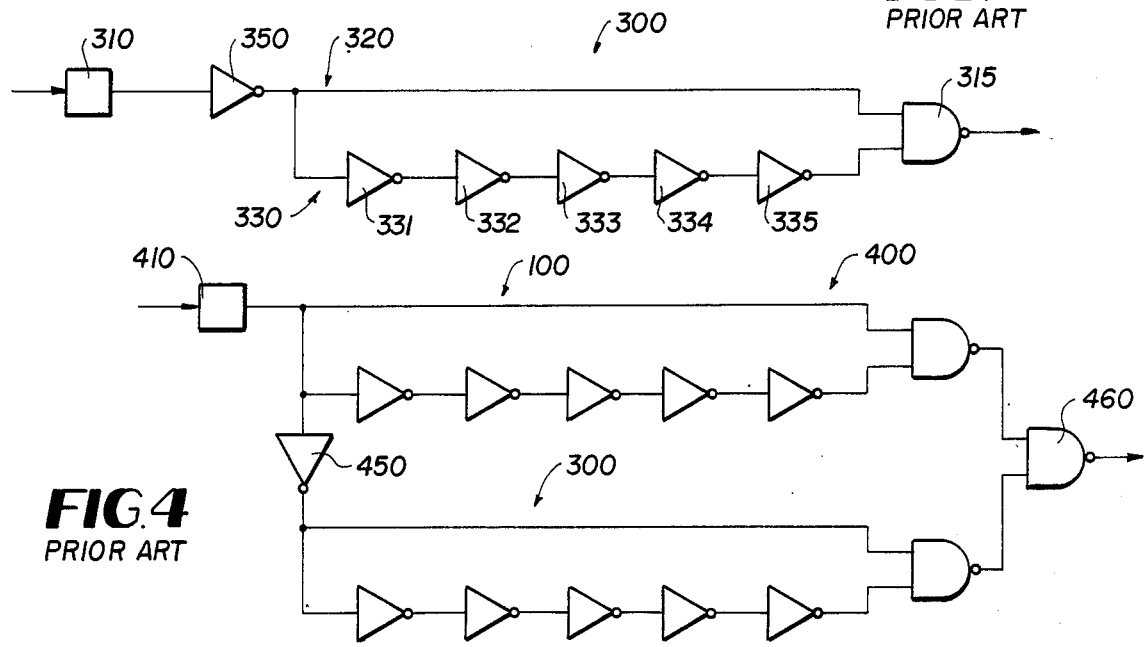
FIG.3 PRIOR ART
FIG.4 PRIOR ART

RETRIGGERABLE EDGE DETECTOR FOR EDGE-ACTUATED INTERNALLY CLOCKED PARTS

BACKGROUND OF THE INVENTION

The present invention relates generally to electrical digital pulse handling and, more specifically, to circuits which detect either a rising or falling signal edge on an input signal and generate output pulses in response to such input pulse transitions.

Clock producing or clock generating circuits wherein the circuit produces an output pulse in response to input pulse edge transitions are known in the prior art. Circuit elements which delay and/or invert electrical signals upon propagation therethrough have been used in one or both of parallel paths between input and output logic means in these clock generators. Such a conventional edge detector circuit 100 is shown in FIG. 1. Input signal receiving means 110 has first and second signal transmitting paths 120 and 130, respectively, connected thereto. First signal path 120 transmits signals substantially without delay. Second signal path 130 transmits signals with a predetermined delay caused by negative logic elements 131-135. These logic elements are commonly signal inverters. For each rising or falling input signal transition edge, circuit 100 will generate an output pulse through gating means 115, which is illustrated as a NAND gate having inputs from signal paths 120 and 130, and transmitted along signal path 140. The width of this output pulse is determined by the number and nature of inverters 131-135 in delay line 130, each of said inverter having a characteristic delay time. For convenience of discussion below, each of these inverters and NAND gate 115 will be assumed to create the same signal delay.

FIGS. 2A-2G illustrate ideal or theoretical square wave forms occurring in the circuit of FIG. 1 at the corresponding alphanumeric nodal locations in response to a step input signal. As the signal input through signal receiving means 110 changes from a low, or "0", to a high, or "1", voltage level, signal transition edge 110 is transmitted through undelayed signal path 120 to NAND gate 115 and through delayed signal path 130 to inverter 131. Passing through inverter 131, this input signal is inverted and time delayed, thus creating transition edge 220 which is input to inverter 132. Likewise, inverter 132 transmits an inverted and delayed signal having transition edge 230 to inverter 133, and so on through inverters 134 and 135 with transition edges 240 and 250, respectively.

When the input signal to circuit 100 has been low or high for a time longer than the total characteristic delay times of inverters 131-135, gate 115 is at one of its two "rest" states and the signal from delay path 130 to NAND gate 115 will be high or low, respectively. Initially, when transition edge 210 is input to NAND gate 115, a low output is produced with transition edge 280, as both NAND inputs are high. After the total delay period of path 130, transition edge 260 is input to NAND gate 115 and a high output is again produced with transition edge 270. The width of the output pulse defined between transition edges 270 and 280 is a function of the total delay time of path 130 and may be altered by selecting the appropriate number and type of inverters therein. For a given delay path, this and other standard "glitch makers" will generate an output pulse of substantially constant width, as long as the input signal does not have other edge transitions within the "delay" time, or the time it takes transition edge 210 to propagate through signal path 130.

The conventional edge detector may also be generally understood as follows. NAND gate 115 has, as mentioned above, two rest states during which a high signal is output. The waveforms illustrated in FIGS. 2A-2G represent the several intermediate states of the circuit in response to input signal transitions prior to reaching a rest state. If an input transition from 0 to 1 occurs at time T=0 then: at time T less than 0, path 120 input to gate 115 is 0, path 130 input to gate 115 is 1, and gate 115 output is 1; at T greater than 0 but less than the delay time, path 120 input to gate 115 is 1, path 130 input to gate 115 is still 1, and gate 115 output becomes 0; at T greater than the delay time, path 120 input to gate 115 remains 1, but path 130 input to gate 115 becomes 0, and, thus, gate 115 output returns to 1.

Note that the conventional edge detection shown in FIG. 1 and mentioned thus far is only a rising edge detector. For input signal transitions from 1 to 0, i.e., a falling edge, no output pulse would be produced by gate 115. For T between 0 and the delay time, paths 120 and 130 both input 0 to gate 115. At all other times, one path inputs a 1 while the other path inputs a 0. Thus, gate 115 always outputs a 1.

To create a conventional falling edge detector, inverter 350 may be included in circuit 300 at the input of conventional converter circuit 100, as shown in FIG. 3. To detect both rising and falling edge signal transitions, circuits 100 and 300 may be combined in parallel as shown in FIG. 4, sharing input signal receiving means 410 and terminating NAND gate 460.

Conventional edge detector circuits commonly have a problem if more than one input signal transition occurs in a time period less than the total delay line signal propagation time. FIGS. 5A-5G illustrate the ideal waveforms occurring in circuit 100 at the corresponding alphanumeric nodal locations in response to a rapidly changing step input signal. Input signal transitions are shown, for example, to occur at time intervals equivalent to twice the characteristic delay time of inverters 131-135. First input signal transition 510 starts a signal propagating in delay path 130, and next input signal transition 512 occurs before the signal from the first transition has finished progating down path 130. Thus, circuit 100 is not in its rest state when transition 512 occurs, and the full output pulse is not produced by NAND gate 115 in response to the last input signal transition.

More specifically, rising signal transition 510, falling signal transition 512, and rising signal transition 514 are input signals to circuit 100 and propagate down paths 120 and 130. Inverter 131 delays and inverts these signals so as to create falling transitions 520 and 524 and rising transition 522, corresponding to transitions 510, 514, and 512, respectively. Similarly, inverter 132 delays and inverts these signals from inverter 131 so as to create rising transitions 530 and 534 and falling edge 532 corresponding to rising transitions 510 and 514 and falling transition 512. Likewise, inverter 133 creates falling transitions 540 and 544 and rising transition 542, inverter 134 creates rising transitions 550 and 554 and falling transition 552, and inverter 135 creates falling transitions 560 and 564 and rising transition 562, each set of signals corresponding respectively to transitions 510, 514, and 512.

Path 130 inputs a high signal to NAND gate 115 while path 120 inputs signal transitions 510 to high, 512 to low, and 514 to high, thus causing gate 115 to output transitions 570, 572, and 574, respectively. Path 120 inputs a high signal to NAND gate 115 while path 130 inputs signal transitions 560 to low, 562 to high, and 564 to low, thus causing gate 115 to output transitions 576, 578, and 580, respectively. Since signal transitions in paths 120 and 130 are each separated by a period of time equal to twice the "unit delay", or the characteristic delay of each inverter, and the total delay time of path 130 results in the leading signal transition propagating down path 130 to be delayed a period of time equal to five times the unit delay, output signal transitions 574 and 576 create a narrow pulse 592 having only a single unit delay width.

When compared to the output signal of a single input signal transition, as shown in FIG. 2G, the rapid transition input signal produces a ripple effect of several short output signal pulses 591, 592, and 593. When input signal transitions are not ideal, but rather, have a discrete rising or falling time, this deficiency in conventional edge detectors is exacerbated. The delay path circuit elements and the terminating logic gate may not detect one input transition quickly enough before another input transition arrives, and, thus, fail to respond with any output pulse at all.

Such rapid transitions are not an uncommon occurrence and may be caused, for example, by noise on the address bus of a memory circuit chip prior to a stable address and may prevent the start of a full clocking cycle. This may present a serious problem since a memory chip must produce the correct output at a predetermined time after a valid address is presented. Conventional edge detector circuits have thus had to require the address inputs to be stable for some period of time before the true address is presented in order to allow the delay line circuitry to come to its rest state. Since the trend in electronic memory devices is to require faster and faster system response time and memory devices are commonly used in "noisy" environments, it is desirable to decrease this time as much as possible.

SUMMARY OF THE INVENTION

An object of the present invention is the provision of a circuit for detecting either a rising or a falling signal edge and generating an output pulse in response thereto.

Another object is to provide an edge detector capable of generating an output pulse of predetermined, constant width regardless of the frequency of input pulses.

A further object is the provision of an edge detector capable of starting a full clocking cycle on the last address transition even if the user has changed the address inputs to that circuit several times before a stable address is presented.

A further object of the invention is the provision of a retriggerable edge detector which will generate a full output pulse of predetermined width and which may be used as a clock pulse for memory circuits upon the last input transition regardles of noise on the address bus prior to a stable address or the time elapsed since the last input transition.

These and other objects of the present invention are attained in the provision of an edge detector system wherein one of the delay lines is always reset to the rest state while a signal is propagating in the other delay line and such resetting takes less time than signal propagation time through the entire delay line. More specifically, a retriggerable edge detector is provided having a means for receiving digital input signals, at least two signal transmitting paths connected to that signal receiving means, one of which paths transmits the input signal with predetermined delay, output gating means for producing an output signal as a function of the signals transmitted by the signal paths, and wherein logic means are provided in the delay signal path so as to cause the output gating means to produce a signal output pulse of predetermined, constant width in response to the last of one or more input signals, irrespective of the pulse or transition frequency of those input signals. This logic means provides for a portion of the delay signal path to be reset to its input state in a shorter time than the total delay line propagation time.

A plurality of such edge detector circuits may be combined with appropriate delay and/or inversion means therebetween such that the start of a full clocking cycle is enabled by input pulses' rising and/or falling edges. The problem of short output pulses can then be solved by resetting the delay path in one of these circuits while the signal is propagating through the other circuit. This is possible because, as mentioned above in the Background of the Invention, these detector circuits are used alternatively, i.e., rising transitions are detected on the rising edge detector only if the input is not already high. A third signal transmitting path which also provides signal delay may be employed in each edge detector so as to provide further means to reset the delay path. The logic means may include a plurality of logic elements and may employ negative logic. This circuit may be used in the newly designed CMOS 16L8 PAL and in the 32K and 64K CMOS PROMS.

Other objects, advantages, and novel features of the present invention will become apparent from the following detailed description of the invention when considered in conjunction with the accompanying drawings.

BRIEF DESCRIPTION OF THE DRAWINGS

FIG. 1 shows a conventional rising edge detector circuit.

FIGS. 2A-2G are timing diagrams of waveforms theoretically occurring in the device according to FIG. 1 at the corresponding alphanumerically indicated nodal locations of FIG. 1 as a result of a single input signal transition.

FIG. 3 shows a conventional falling edge detector circuit.

FIG. 4 shows a conventional detector circuit for rising and falling edges.

DESCRIPTION OF THE PREFERRED EMBODIMENT

The preferred embodiment of the present invention is intended for use in an address buffer of an integrated memory circuit to generate an output pulse of predetermined width when it detects a rising or falling edge transition in the input signal. This pulse has a width determined by the delay line and is used as a clock signal for other circuits in the memory. Each edge detector circuit of the present invention includes at least one input signal delaying path and at least one path where the input signal is transmitted substantially without delay. Negative logic means are provided in the delaying path which have as inputs both the delayed and undelayed signals and which change their gating state quickly in response to undelayed signals and slowly in response to delayed signals. Thus, the undelayed signals are employed to reset the logic means to its rest state after delayed signals pass therethrough. This resetting prevents a ripple effect in the output signal in response to rapid input signals and allows an output pulse of predetermined width to be produced in response to the last input signal transition.

Figure 6:
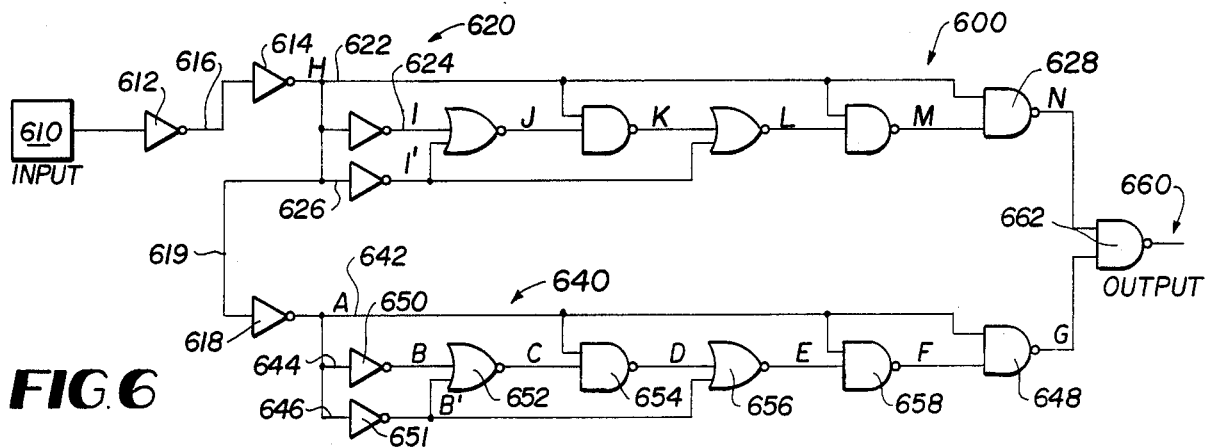
FIG. 6 shows a schematic block diagram of a retriggerable edge detector according to the present invention.

FIG. 6, which illustrates a preferred embodiment of the retriggerable edge detector of the present invention, shows a circuit system 600 having input signal receiving means 610 for receiving digital input pulses, a rising edge detector circuit 620, a falling edge detector circuit 640, and a signal output path 660 for transmitting output pulses in response to edge transitions of input pulses. Input pulses may have rising or falling leading edges. Inverters 612 and 614 are disposed in input signal path 616 between input signal receiving means 610 and edge detector circuit 620. Inverter 612 may, for example, be a TTL to CMOS level shifter having large capacitance. Such a device may be employed whenever it is necessary to smooth out extremely fast input signal spikes. Inverter 618 is positioned in signal path 619 between rising edge detector 620 and falling edge detector 640 and corresponds functionally to inverter 350.

Edge detectors 620 and 640 are shown in FIG. 6 to be formed in substantially the same manner from substantially the same components, with the exception of inverter 618. While it may be advantageous to do so in a particular embodiment, the present invention specifically contemplates other structural variation between circuits 620 and 640. Since each circuit 620 and 640 functions substantially similarly with regard to signal propagation, only a single representative circuit 640 will be described below in detail.

Edge detector 640 contains at least two signal transmitting paths, 642 and 644, respectively, and may advantageously contain a third signal transmitting path 646. First signal path 642 transmits input signals substantially without delay to output logic means 648. Second and third signal paths 644 and 646 are provided with logic means to transmit signals with predetermined delay, with path 644 also connected to output logic means 648. The signal delay of these latter two signal paths need not be identical and is a function of the particular logic means employed therein. The logic means provided in path 644 may include, for example, inverter 650 and, NOR gates 652 and 656, and NAND gates 654 and 658. Thus, the present invention modifies conventional delay line 130 to include logic gates as well as inverters, while maintaining the odd number of inversion stages. Also unlike the prior art, circuit elements in delay line 644 receive control signals from other transmission lines, in this case, from nondelay path 642 and delay path 646. Although only negative logic means are illustrated in FIG. 6, it is to be clearly understood that equivalent positive logic systems are within the scope of the present invention.

The NAND and NOR gates in delay path 644 are unsymmetrical gates. That is, they are constructed so as to change their state more quickly, i.e., have a shorter gate delay, in response to signals from one control input than another control input. This may be, for example, accomplished by making one input gate length significantly longer. In the preferred embodiment of the present invention, NOR gates 652 and 656 change state more quickly in response to control signals from third signal path 646 than control signals from second signal path 644. Likewise, NAND gates 654 and 658 change state more quickly in response to control signals from nondelay path 642 than control signals from delay path 644. Control signals to which these logic gates respond most quickly to are hereinafter referred to as "reset" signals.

Inverter 650 is constructed in a way that causes the time delay of the input signals propagating therethrough to be relatively long, as compared to the time delay of the logic gates in response to reset signals. The delay time of inverters 618, 650 and 651 need not be identical, and it is particularly advantageous to construct inverters 618 and 651 to have at least as short a delay time as the logic gates responding to reset signals where "fast" reset signals are expected to propagate through delay line 646.

Output logic means 648 is a NAND gate which combines the control signals produced by delay path 644 and nondelay path 642 and produces a full output pulse after the last input signal transition through input means 610. Terminal gating means 662, shown, for example, as a NAND gate and receiving control signals from output logic means 628 and 648 of edge detectors 620 and 640, transmits a final output signal to path 660.

The series combination of inverter 650, NOR gate 652, NAND gate 654, NOR gate 656, and NAND gate 658, respectively, in delay path 644, having reset signals from paths 642 and 646, permits a fast reset of this path to its rest state at each of the alphanumerically indicated nodal locations thereon so as to have the circuit always ready to detect the next signal transition. Although the resetting circuitry is fast compared to the signal delay circuit, it is not instantaneous. However, extremely rapid transitions are filtered out by inverter 612 and, thus, present no problem.

The operation of circuit 600, focusing on edge detector 640, will now be briefly discussed. At the low rest state, the input signal is 0 through signal receiving means 610. Through inverters 612 and 614, detector 620 also receives a 0 input signal. Through inverter 618, detector 640 receives a 1 input signal at A. This becomes a 0 through inverters 650 and 651 at B and B', respectively, a 1 through NOR gate 652 at C, a 0 through NAND gate 654 at D, a 1 through NOR gate 656 at E, and a 0 through NAND gate 658 at F, respectively, along delay path 644. Thus, NAND gate 648 produces a 1 output in response to a 1 control signal from nondelay path 642 and a 0 control signal from delay path 644. Similarly, detector 620 produces a 1 output in response to its 0 input signal and, thus, terminating NAND gate 662 produces a 0 output.

When a rising signal transition occurs, a 0 input signal is received through inverter 618 at A and immediately becomes a control signal for NAND gate 648. Since NAND gate 648 changes state only upon two 1 control signals being input, no output pulse is produced by detector 640 in response to this transition. However, the 0 input signal through inverter 618 at A results in a 1 through NAND gates 654 and 658 and at D and F, respectively, and a 1 through inverter 651 at B' prior to the propagation of this input signal through inverter 650. The signal delay time through inverter 651 and NOR gates 652 and 656 may be selected so as to result in a 0 signal at C and E at approximately the same time as nodal locations D and F change state to 1. These nodal states correspond to the second rest state of the circuit, in which detector 640 is responsive to falling signal transitions. The propagation of the input signl down delay path 644 ceases at B since NOR gate 652 does not now change state in response to this change of state through inverter 650 from 0 to 1. Circuit 640 is, thus, ready to respond to falling signal transitions by producing a full output pulse immediately after the short period of delay of the reset signals through the individual logic means being reset. Transitions occurring in shorter time periods are filtered out by inverter 612.

When a falling signal transition occurs, a 1 input signal is received through inverter 618 at A. Since NAND gate 658 still sends a 1 control signal to NAND gate 648, upon transmission of the 1 input signal down nondelay path 642, the output signal through NAND gate 648 will change from 1 to 0. Again, logic means in delay path 644 are selected such that this occurs relatively quickly with respect to the signal propagation time down that path and the frequency of input signal transitions. The width of this output signal is determined by the lesser of either the total signal delay of delay path 644 or the time period before the next signal transition. The falling edge signal is propagated through inverter 650 and the logic means of path 644 until NAND gate 658 changes state again so that its control signal to NAND gate 648 is 0. At this point, the output NAND gate 648 returns to 1. This output pulse may also be cut off by a rising signal transition which also inputs a 0 control signal through NAND gate 648 via inverter 618 and nondelayed path 642. Since rising edge detector 620 is similarly reset to its rest state by the falling signal transition, such a rising signal transition would initiate an output pulse from detector 620. Thus, a sequence of short output pulses results from rapid input transitions to circuit 600 until either the last transition of the input signal or an input signal having a pulse width equal to or greater than the total delay time of the delay path of each detector circuit. Triggering of a clock cycle by an output pulse resulting from the former occurrence represents a distinct improvement over the prior art.

FIGS. 7H–7N illustrate the operation of a rising edge detector circuit 620 according to the present invention in response to a plurality of rapidly changing step input signals. This Figure shows timing diagrams of theoretical waveforms occurring in the present invention and may be compared with FIGS. 2A–2G and 5A–5G to illustrate improvement of the present invention over the prior art. As mentioned above, circuit 620 may be identical to circuit 640, expect for inverter 618, and, thus, has nondelay path 622 and delay paths 624 and 626. For convenience in discussion, the gate delays of logic elements responding to signals from delay path 624 and the delay time of the inverter means in delay path 624 will be assumed to be equal, although such an arrangement is clearly not essential to the subject invention.

Briefly, the circuit input signal includes rising signal transitions 710 and 714 and falling signal transition 712, separated by a period of time equal to, for example, twice the delay time of the inverter means in delay path 624. Through this inverter and the inverter in delay path 626, these signals become falling transitions 720 and 724 and rising transition 722. The control signals to the first NOR gate in delay path 624 are both low, then high, and then low, thus the control signal through that gate to the first NAND gate next in series has rising transitions 730 and 734 and falling transition 732. The other control signals to that NAND gate include rising transitions 710 and 714 and falling transition 712 which serve to reset that logic gate, as described above. The control signal transmitted from that first NAND gate to the second NOR gate is significantly modified and includes only falling transition 740. The other control signal input to the second NOR gate is from the inverter of the delay path 626. This latter signal serves to reset the second NOR gate such that the control signal transmitted to the second NAND gate includes only rising transition 750. Again, this logic gate has resetting control signals from the transmission of the circuit input signals along nondelayed path 622. The resulting control signal to the output NAND gate includes only falling transition 760. The other control signal to the output NAND gate is the circuit input signal. The resulting output pulse includes falling transitions 780 and 784 and rising transitions 782 and 786. Pulse 790 between transitions 784 and 786 is responsive to final input signal rising transition 714 and has a full width determined by the total gate delay time of the delay path 624.

Figure 5:
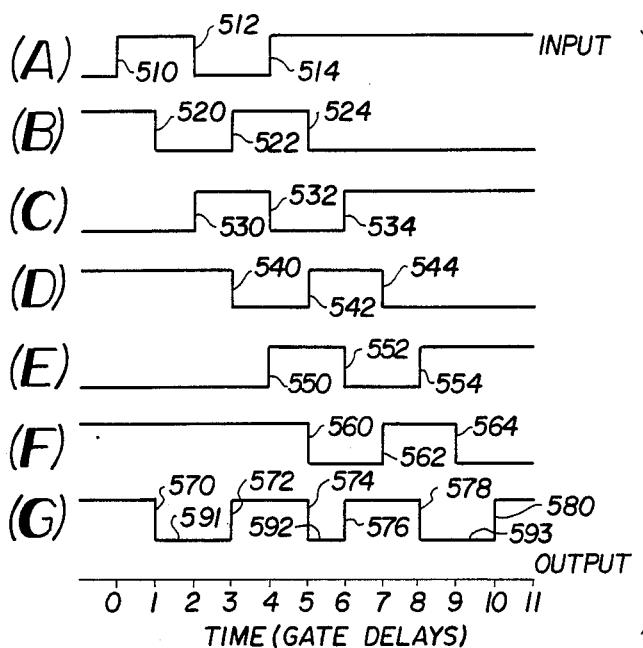
FIGS. 5A-5G are timing diagrams of the waveforms theoretically occurring in the circuit of FIG. 1 at the corresponding alphanumerically indicated nodal locations of FIG. 1 as a result of a plurality of rapid input signal transitions.
Figure 7:
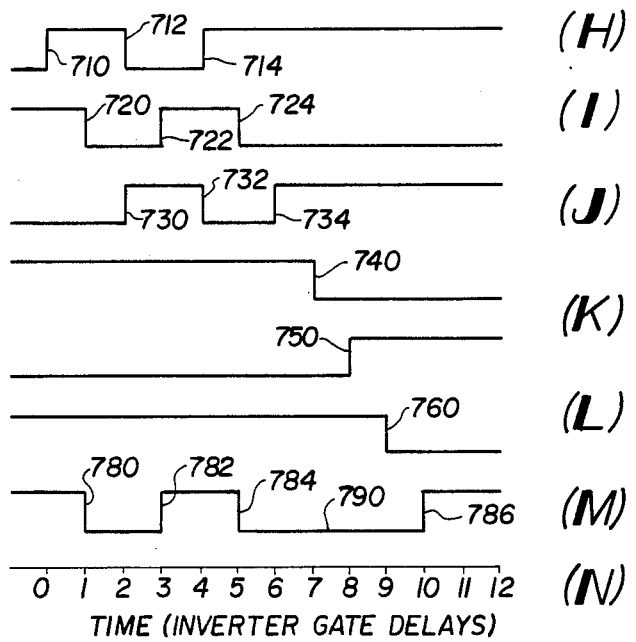
FIGS. 7H-7N are timing diagrams of the waveform theoretically occurring in the device shown in FIG. 6 at the corresponding alphanumerically indicated nodal locations of FIG. 6 as a result of a plurality of rapid input signal transitions.

The pulse output of the present invention in response to a single input edge or step input is the same for the present invention and the conventional prior art circuit. The proof of this is deemed to be readily apparent to one skilled in the art in light of the above disclosure and will, thus, not be presented herein. Both produce an output pulse, as shown in FIG. 2G of a full or "standard" width, arbitrarily defined in the timing diagrams as five gate delay units. FIG. 7, however, and more particularly FIG. 7N, when compared with FIG. 5G, shows the differences in output pulses between the prior art devices and the present invention in response to a plurality of rapidly changing input signal edge transitions. The prior art devices are only capable of producing a series of short output pulses, 591, 592, and 593, for example. The present invention however, permits a full output pulse 790 of the same width as an output pulse responsive to a single step input. This results from the resetting of delay line 624 to its rest state, as shown in FIGS. 7K–7M. Resetting of delay signal path 624 occurs faster than the entire delay line propagation time, and, therefore, the edge detector is retriggerable.

Thus, a circuit is provided which enables the start of a full clocking cycle upon the last address transition even if the user has changed the address inputs to that circuit several times before a stable address is presented. Similarly, the edge detector is not adversely affected by noise on the address bus. The circuit of the present invention responds consistently to produce a full output pulse whenever appropriate regardless of the time difference between input signal transitions.

From the preceding description of the preferred embodiment, it is evident that the objects of the invention are attained. Although the invention has been described and illustrated in detail, it is to be clearly understood that the same is by way of illustration and example only and is not to be taken by way of limitation. The spirit and scope of this invention are to be limited only by the terms of the appended claims.

What is claimed is:

1. In an edge detector having input means for receiving input signals; first and second path means connected to said input means for transmitting input signals, said second path means having means for transmitting said input signals with predetermined delay; and output gating means connected to said first and second path means for producing a signal output as a function of the signals transmitted by said first and second path means; the improvement comprising:

logic means in said second path which causes said output gating means to produce an output pulse of predetermined width equal to or greater than said predetermined delay in response to the last of a plurality of input signals of shorter period than the predetermined delay.

2. The edge detector according to claim 1 wherein said logic means includes a plurality of logic elements which delay and invert input signals and wherein each of said logic elements has asymmetric inputs such that a gate delay time through one input is less than a gate delay time through another input to the same logic element.

3. The edge detector according to claim 2 wherein each of said logic elements includes gating means connected to said first path and said second path for resetting said logic elements to a rest state in response to a plurality of input signals transmitted along said second path within a predetermined time period.

4. The edge detector according to claim 1 including a third path means connected in parallel to at least a portion of said second path for transmitting input signals, and wherein said first path means transmits input signals substantially without delay.

5. A digital signal edge detector system comprising:
input means for receiving input signals;
first and second edge detector means connected to said input means, each of said edge detectors including first and second signal transmitting paths, said second paths having means for transmitting said input signals with predetermined delay;
output gating means connected to each of said first and second edge detector means for producing an output as a function of the signals transmitted by the first and second paths of said edge detectors; and
logic means in each of said second paths for causing said output gating means to produce a pulse of predetermined, constant width in response to a plurality of input signals, irrespective of the period of time between said input signals.

6. The edge detector system according to claim 5 further including a terminal gating means connected to said output gating means for producing an output pulse as a function of the signals produced by said output gating means.

7. The edge detector system according to claim 5 wherein said logic means includes a plurality of negative logic elements which delay and invert input signals and wherein filter means connected to said input means is provided to filter out input signals having a pulse width less than the shortest gate delay time of said logic means.

8. The edge detector system according to claim 5 further including in each of said edge detectors a third path connected in parallel with at least a portion of said second path for transmitting input signals.

9. A retriggerable edge detector comprising:
an input means for having a digital input signal supplied thereto;
an output logic means;
a first and second signal path for transmitting input signals from said input means to said output logic means, said second signal path including in series a first inverter and a plurality of logic gate means; and
wherein said first and second path terminate at said output logic means and a third signal path, connected in parallel with at least a portion of said second path, provides input signals to at least one of said logic gate means in said second path.

10. The retriggerable edge detector according to claim 9 wherein each of said logic gate means causes the same, predetermined delay in transmission of said input signal.

11. The retriggerable edge detector according to claim 9 wherein said logic gate means in said second path is reset to a rest state in response to a plurality of input signal transitions occurring at the input means within a predetermined time period.

12. The edge detector system according to claim 9, wherein said first signal path provides input signals to at least one of said logic gate means in said second signal path other than that logic gate means responsive to signals from said third signal path.

13. The edge detector system according to claim 12, wherein said logic gate means are formed asymmetrically such that their gate delay time in response to input signals from one input is less than their gate delay time in response to input signals to said logic gate means from said first and third signal paths is less than the delay time of input signals from said second signal path.

14. The edge detector system according to claim 13, wherein filter means connected to said input means are provided to prevent transmission of input signals to said signal paths having a pulse width shorter than the shortest input signal delay time of said logic gate means.

* * * * *